(12) United States Patent
Arutinov et al.

(10) Patent No.: US 11,282,821 B2
(45) Date of Patent: Mar. 22, 2022

(54) LIGHT INDUCED SELECTIVE TRANSFER OF COMPONENTS

(71) Applicant: Nederlandse Organisatie voor toegepast-natuurwetenschappelijk onderzoek TNO, s-Gravenhage (NL)

(72) Inventors: Gari Arutinov, Helmond (NL); Ronald Stoute, Eindhoven (NL); Edsger Constant Pieter Smits, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/764,619

(22) PCT Filed: Nov. 20, 2018

(86) PCT No.: PCT/NL2018/050776
§ 371 (c)(1),
(2) Date: May 15, 2020

(87) PCT Pub. No.: WO2019/103603
PCT Pub. Date: May 31, 2019

(65) Prior Publication Data
US 2020/0335483 A1    Oct. 22, 2020

(30) Foreign Application Priority Data
Nov. 21, 2017  (EP) ..................... 17202786

(51) Int. Cl.
*H01L 25/075*  (2006.01)
*H01L 23/00*  (2006.01)

(52) U.S. Cl.
CPC .......... *H01L 25/0753* (2013.01); *H01L 24/97* (2013.01)

(58) Field of Classification Search
CPC .......................... H01L 25/0753; H01L 24/97
See application file for complete search history.

(56) References Cited

U.S. PATENT DOCUMENTS 8,349,116 B1    1/2013  Bibi et al.
10,002,856 B1 *  6/2018  Bedell ................ H01L 21/6836
(Continued)

FOREIGN PATENT DOCUMENTS

WO  WO 2010/132552 A1  11/2010
WO  WO 2016/154956 A1  10/2016

OTHER PUBLICATIONS

European Patent Office, International Search Report in corresponding International Application No. PCT/NL2018/050776, dated Apr. 5, 2019 (2 pages).

*Primary Examiner* — Fernando L Toledo
*Assistant Examiner* — Neil R Prasad
(74) *Attorney, Agent, or Firm* — Leydig, Voit & Mayer, Ltd.

(57) ABSTRACT

A method and apparatus for light induced selective transfer of components. A donor substrate (10) with a plurality of components (11,12) divided in different subsets arranged according to respective layouts (A,B). A target substrate (20) comprises recesses (21) and protrusions (25). The donor and target substrates (10,20) are aligned such that a first subset of components (11) is suspended over corresponding recesses (21) in the target substrate (20) and a second subset of components (12) is in contact with corresponding protrusions (25) of the target substrate (20). Light (L) is projected onto the donor substrate (10) to transfer the first subset of components (11) across and into the corresponding recesses (21) while the second subset of components (12) remains attached to the donor substrate (10).

20 Claims, 4 Drawing Sheets

(56) References Cited

U.S. PATENT DOCUMENTS

| | | |
|---|---|---|
| 2002/0064032 A1 | 5/2002 | Oohata |
| 2014/0094878 A1 | 4/2014 | Gossler et al. |
| 2016/0336304 A1 | 11/2016 | Wu et al. |
| 2016/0358885 A1 | 12/2016 | Chang et al. |
| 2017/0162552 A1 | 6/2017 | Thompson |
| 2018/0219123 A1* | 8/2018 | Wang ..................... H01L 27/15 |
| 2019/0280152 A1* | 9/2019 | Kristal ................ H01L 51/0013 |

\* cited by examiner

LIGHT INDUCED SELECTIVE TRANSFER OF COMPONENTS

CROSS-REFERENCE TO RELATED APPLICATIONS

This patent application is a U.S. National Phase of PCT International Application No. PCT/NL2018/050776, filed Nov. 20, 2018, entitled "Light Induced Selective Transfer of Components," which claims priority to European Application No. 17202786.4, filed Nov. 21, 2017, which are both expressly incorporated by reference in their entireties, including any references contained therein.

TECHNICAL FIELD AND BACKGROUND

The present disclosure relates to a method and apparatus for light induced selective transfer of components, e.g. for manufacturing or repairing a micro-LED display.

Micro-LED (µLED) displays are a candidate for future displays clue to their (potential) high brightness, stability, low power consumption, and excellent color gamut. Due to their brightness, only a small area of the pixel area needs to be emissive for high brightness displays. In other words, a relatively low coverage is needed. So, even for relatively high display resolutions, e.g. around 70-600 pixels per inch (PPI), depending on the application, the LEDs can be of very small dimensions, e.g. less than 30 µm. But because µLEDs can be expensive to grow at high temperatures on expensive substrates such as sapphire, it is preferred that as much as possible of the wafer area is utilized for LED fabrication. Accordingly it is desired to selectively transfer components from a growth or other donor substrate to a target substrate with increased pitch (spacing) between the components. For example, U.S. Pat. No. 8,056,222 B2 describes a laser direct write method used to transfer components such as semiconductor bare dies or surface mount passive and active components on a substrate or inside recess in a substrate for making embedded microelectronics. However, when the components on the donor substrate are very small and/or close together, it may be difficult to prevent adjacent components from transferring.

For these and other reasons it is desired to improve assembly methodology of components such as µLEDs, combining high resolution placement and accuracy with high throughput, e.g. for manufacturing displays or other devices.

SUMMARY

Various aspects of the present disclosure relate to methods and systems involved in light induced selective transfer of components. A donor substrate is provided with a plurality of components divided in different subsets. A first subset of components is selected for transfer during a first transfer step and arranged according to a first component layout. A second subset of components is selected to remain on the donor substrate during the first transfer step and arranged according to a second component layout. A target substrate is comprises recesses disposed at least at relative positions corresponding to the first component layout. Protrusions on the target substrate are disposed at least at relative positions corresponding to the second component layout. The donor and target substrates are relatively positioned or aligned, e.g. brought in proximity. By the alignment, the first subset of components is suspended over the corresponding recesses without contacting the target substrate. Furthermore, the second subset of components is preferably in contact with the corresponding protrusions of the target substrate. Light is then projected onto at least the first component layout on the donor substrate. This may cause the first subset of components to transfer across and into the corresponding recesses while the second subset of components remains attached to the donor substrate.

It will be appreciated that contact with the corresponding protrusions may prevent transfer of the second subset of components. For example, the contact may physically block the transfer at those positions. For example, the contacting target substrate may act as a heat sink to at least partially diminish heating of the components at the contacting positions. At the same time the recesses may facilitate the transfer. For example, without contact to the target substrate, the components may be released from the donor substrate and travel to the target substrate. It will be appreciated that the distance travelled can be well controlled by the defined points of contact and/or depth of the recesses. This may improve control over the transfer process. Furthermore, without the heat sinking effect of the contacting target substrate, the suspended components may be heated to a relatively higher temperature causing their release, e.g. by weakening of an adhesive or other reaction at their contact position.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
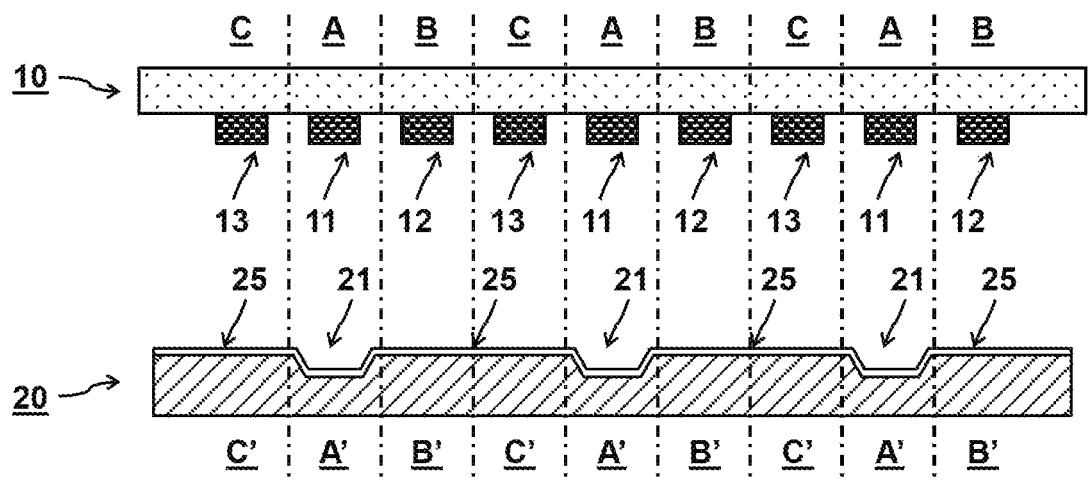
FIGS. 1A-1C schematically illustrate steps in selective transfer of components from a donor substrate to a target substrate according to one embodiment.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1B:
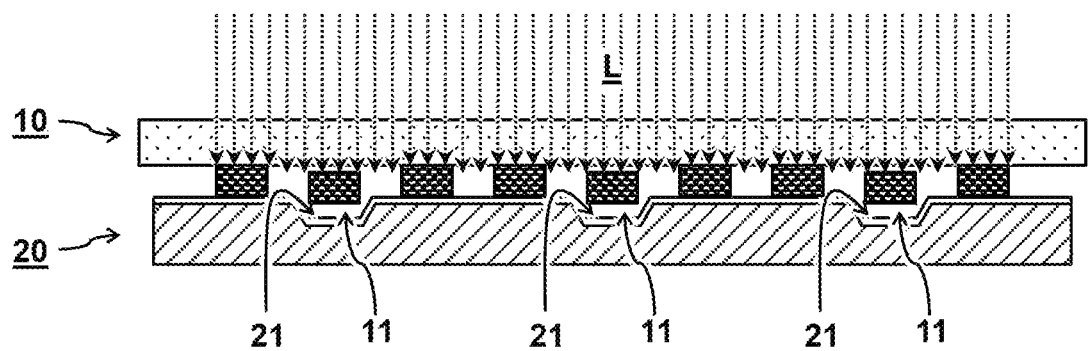
Figure 1C:
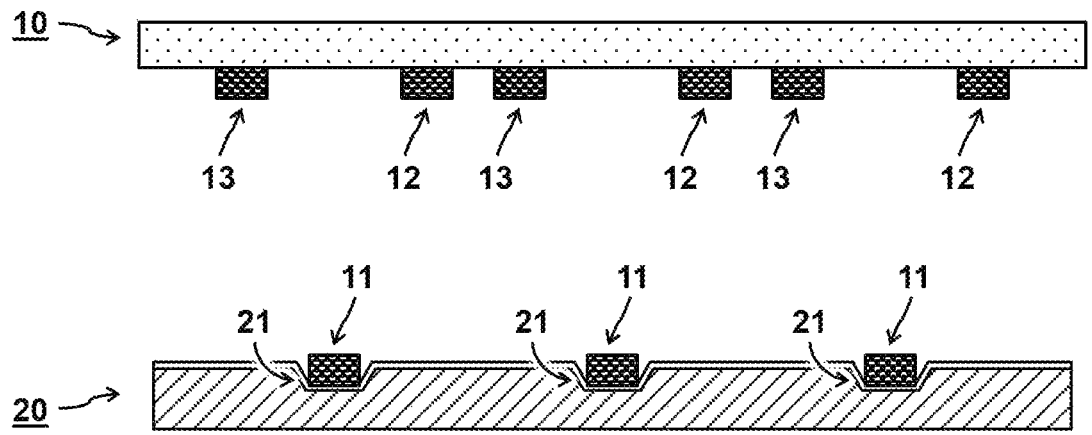

FIGS. 1A-1C schematically illustrate steps in selective transfer of components 11 from a donor substrate 10 to a target substrate 20 according to one embodiment.

In one embodiment, as shown in FIG. 1A, a donor substrate 10 is provided with a plurality of components 11,12,13 divided in different, i.e. exclusive subsets. For example, a first subset of components 11 is selected for transfer during a first transfer step and arranged according to a first component layout "A". In the embodiment shown, a second subset of components 12 is selected to remain on the donor substrate 10 during the first transfer step and arranged according to a second component layout "B". Also further subsets may be defined, e.g. in the shown embodiment the third subset of components 13 is arranged according to a layout "C", which in this case is also selected to remain on the donor substrate during the first transfer step. Of course the remaining components 12 and 13 can also be considered as part of a single layout in this regard.

In a preferred embodiment, a target substrate 20 comprises recesses 21 disposed at least at relative positions A' corresponding to the first component layout "A". In other words, the distances between the recesses 21 correspond to the distances between the first subset of components 11. Also the sizes, e.g. diameters, of the recesses 21 correspond to the sizes of the components 11, so that they fit in the recesses as further explained below. The concept of a recess as used herein generally refers to a concavity or an area of the target substrate 20 whose level is below the average surface level of the target substrate 20.

In a preferred embodiment, the target substrate 20 comprises protrusions 25. The protrusions 25 are disposed at least at relative positions B' corresponding to the second component layout "B". In other words the distances between the dimensions of the protrusions 25 correspond with those of the second subset of components 12 (and third subset of components 13 in this case). For example, protrusions can be formed by non-recessed areas of the target substrate 20, or otherwise. The concept of a protrusion as used herein generally refers to a convexity or an area of the target substrate 20 whose level is above the average surface level of the target substrate 20. Protrusions on the surface of the target substrate 20 may define recesses there between and/or vice versa.

In one embodiment, e.g. as shown in FIG. 1B, the donor and target substrates 10,20 are aligned, i.e. relatively positioned. In the embodiment shown, the first subset of components 11 is suspended over the corresponding recesses 21 without contacting the target substrate 20. Furthermore, as shown, (at least) the second subset of components 12 is preferably in contact with the corresponding protrusions 25 of the target substrate 20.

In some embodiments, light "L" is projected, e.g. in a first transfer step, onto at least the first component layout "A" on the donor substrate 10. Preferably, the donor substrate 10 is transparent to the light "L" so that the light can shine through the donor substrate 10 to illuminate the components 11 from the back. Alternatively, or in addition, light may also shine from other directions, e.g. heating the components which in turn heat an area of the donor substrate, or layer there between, for release. In the embodiment shown, the light causes all of the first subset of components 11 to be deposited or transferred across and into the corresponding recesses 21. At the same time (at least) the second subset of components 12 can remain attached to the donor substrate 10. In the embodiment shown, also the third subset of components 13 remains on the donor substrate 10. It will be appreciated that the contact with the corresponding protrusions 25 may prevent transfer of the second subset of components 12 in the first transfer step (and also the components 13 here). For example, the contact physically blocks the transfer.

In the embodiment shown, at least some of the light "L" is also projected onto the second component layout "B". For example, the whole donor substrate 10 or a significant area thereof may be illuminated. In another or further embodiment (not shown here), the light can also be patterned e.g. to selectively or exclusively illuminate the first subset of components 11. Also in that case, the present methods can be advantageous e.g. in preventing inadvertent transfer of nearby components which can be indirectly heated via the donor substrate 10, especially when the components and distances there between are in a micrometer regime.

In some embodiments (not shown), the second subset of components 12 is selected for transfer during a second transfer step. The second transfer step can be separate from the first transfer step, e.g. takes place at different instances of time and/or place. For example, the second transfer step comprises aligning the donor substrate 10 with the remaining second subset of components 12 over a target substrate (not shown) comprising recesses disposed at least at relative positions corresponding to the second component layout "B". In some such embodiments, the target substrate for the second transfer step is another substrate with other recesses. In other such embodiments, the same substrate is used in the second transfer step, e.g. comprising additional recesses not used in the first transfer step. For example, in the second transfer step, light is projected onto at least the second component layout on the donor substrate to transfer the second subset of components 12 components across and into the corresponding recesses.

In the embodiment shown, the plurality of components includes a third subset of components 13 e.g. components selected to remain on the donor substrate 10 during both a first and second transfer step (not shown). In the embodiment, the third subset of components 13 is arranged according to a third component layout C. For example, the target substrate for transfer in the second transfer step comprises protrusions disposed at least at relative positions corresponding to the third component layout C for contacting the third subset of components 13 during the second transfer step. For example, the third subset of components 13 is selected for transfer during a third transfer step (not shown). Of course the components may also be divided in only two subsets, or divided into more than three subsets of components, e.g. four, five, ten, or more subsets.

In general, different subsets of the components can be transferred in different transfer steps into different recesses on the same or different target substrates. Preferably, each transfer step is effected by a separate (single) pulse of light "L" or a separate sequence of pulses. Alternatively, a continuous light source could be used in principle.

In some embodiments, components of first subset of components 11 are interspersed with components of the second subset of components 12 on the donor substrate 10. Accordingly, the density of components on the donor substrate 10 can be relatively high compared to the density on the target substrate 20. In the embodiment shown, the components 12 in the second subset have the same relative positions as the components 11 in the first subset. In other words, the second component layout "B" is the same but shifted as the first component layout "A". This may have an advantage that the same target layout of recesses can be filled with either of the component layouts "A" or "B". For example, a first target substrate with recesses is filled with the first subset of components 11 and a second target substrate with identical recess layout is filled with the second subset of components 12.

In the embodiment shown, the components 12 of the second subset are (directly) neighboring the components 11 of the first subset on the donor substrate 10. It will be appreciated that particularly for such neighboring components it may be difficult to control localized heat deposition in the donor substrate 10, especially for small components and/or high densities. Accordingly the present methods and systems may prevent inadvertent transfer of such neighboring components.

In some embodiments (not illustrated here), components are transferred onto a circuit for connection therewith. For example, solder material or conductive adhesive is disposed on the target substrate to connect the component with the circuit, e.g. electrodes. Alternatively, or in addition, solder or other material may be disposed underneath the components on the donor substrate and transferred together with the components. Soldering or other types of connections can be performed in one step, in some embodiments. For example, the heat from the light may cause both transfer and soldering. Alternatively, or in addition, the components may also be connected to a circuits after transfer. In some embodiments, the components comprise one or more electrical connections on top, i.e. facing away from the target substrate. For example, a connection can be made to such component by depositing, e.g. printing, an electrode on top of the target substrate advantageously connecting to the top. It will be appreciated that the recessed components can be more easily connected to the top from an adjacent (relatively raised) level of the target substrate which can be flush with the component in some embodiments. Also connections to the side of the component may be envisaged. It will be appreciated that side connections may be further facilitated by providing the recess with sloped edges.

Figure 2A:
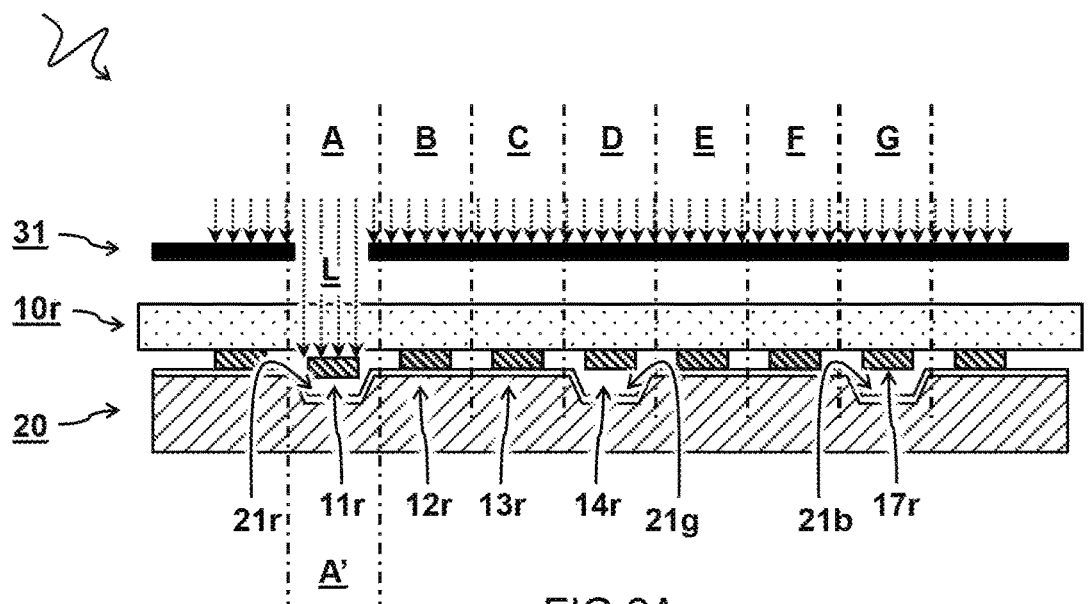
FIGS. 2A-2C schematically illustrate steps for selective transfer of different components from different donor substrates according to another embodiment.
Figure 2B:
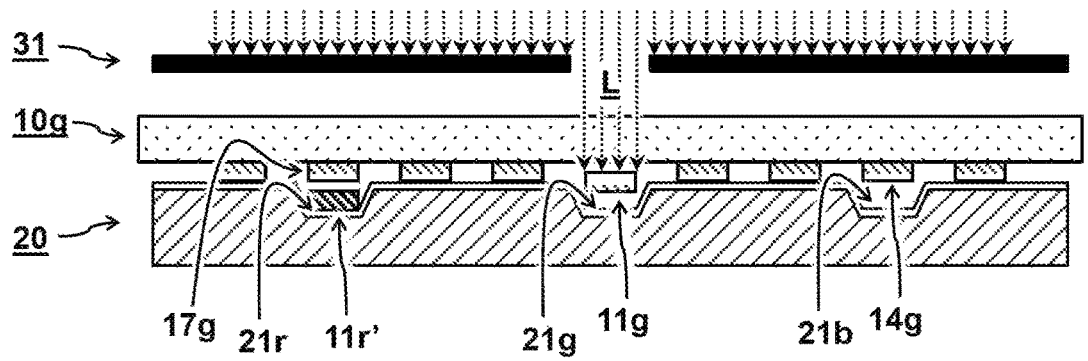
Figure 2C:
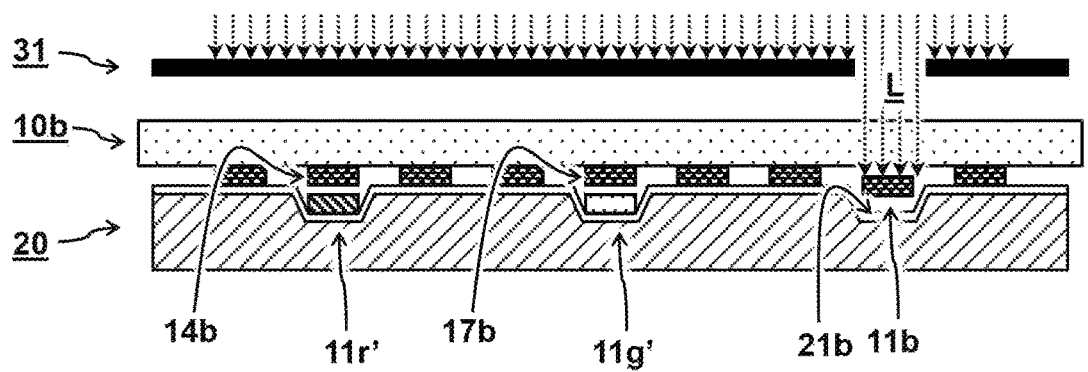

FIGS. 2A-2C schematically illustrate steps for selective transfer of different components 11r,11g,11b from different donor substrates 10r,10g,10b according to another embodiment.

In the embodiment shown, the light "L" is patterned according to the first component layout "A". In other words, the light "L" is exclusively projected onto the first subset of components 11 and/or the light "L" is blocked from projecting onto any of the other component layouts (here layouts "B" through "G"). For example, a mask is disposed between the light source (not shown here) and donor substrate 10. A mask can be particularly useful for light sources such as a flash lamp. For example, the mask passes or reflects light to project onto the first component layout "A" while preventing light from projecting onto at least the second component layout "B", and in this case also preventing light onto any of the other layouts. Alternatively or in addition to a mask, the light can be patterned or otherwise localized in different ways, e.g. one or more relatively narrow or focused beams of (laser) light can be used.

FIG. 2A illustrates a first transfer step, according to some embodiments, wherein a first component 11r is transferred from a first donor substrate 10r in a first recess 21r on the target substrate 20. Of course also multiple of the same first components 11r can be transferred at different locations depending on the first component layout A. In the embodiment shown, e.g. components 12r,13r are in contact with the target substrate 20 so they remain on the first donor substrate 10r. In the embodiment shown, another component 14r on the first donor substrate 10r is suspended over a second recess 21g but not illuminated by the light "L" and thus not transferred during the first transfer step into the second recess 21g. The same is also the case for component 17r here. Preferably, as shown, a mask 31 is disposed in the light beam to selectively block light from reaching said other component 14r.

FIG. 2B illustrates a second transfer step, according to some embodiments, wherein a second component 11g is transferred into the second recess 21g. In some embodiments, the second component 11g is transferred from a second donor substrate 10g. For example, the second donor substrate 10g is different from the first donor substrate 10r, e.g. comprising different components. In the embodiment shown, another component 17g on the second donor substrate 10g is suspended over the previously deposited first component 11i in the first recess 21r. Preferably, though not necessarily, said other component 17g is not in contact with the previously deposited first component 11i. For example, the first recess 21r is deeper than a thickness of the previously deposited first component 11r'. This may prevent inadvertent transfer of said other component 17g. Furthermore, as shown, during the second transfer step, yet another component 14g on the second donor substrate 10g may be suspended over a third recess 21b but not illuminated by the light "L" and thus not transferred into the second recess 21g.

FIG. 2C illustrates a third transfer step, according to some embodiments, wherein a third component 11b is transferred from a third donor substrate 10b in the third recess 21b on the target substrate 20. In the embodiment shown, other components 14b,17b on the third donor substrate 10b are suspended above the previously deposited first and second components 11r',11g' in the respective first and second recesses.

In some embodiments (not shown), the target substrate 20 comprises redundant recesses which can be used to deposit additional components e.g. for repairing a device with broken components such as a display screen with broken pixels. Some aspects of the present disclosure may provide a method for repairing a target substrate 20 with previously deposited components 11 in recesses 21, e.g. previously manufactured according to a method as described herein or otherwise. For example, in some embodiments the target substrate 20 comprises redundant empty recesses adjacent the recesses 21 with the previously deposited components 11. Accordingly, a repair method may e.g. comprise locating a broken component among the previously deposited components 11 and adding another component in a redundant recess adjacent the broken component using a method as described herein. Instead of using redundant recesses, the substrate may also be repaired by removing broken components in any way and proceeding with the insertion of a new component in the recess cleared of the broken component according to the method as described herein.

These or other methods of repair may also be incorporated as part of a manufacturing process, e.g. by testing and/or locating the presence of broken components on the target substrate after one or more initial transfer steps. If broken components are detected and/or located, the methods as described herein can be used to fix or supplement any broken components to repair the target substrate For example, a method for manufacturing a display screen may comprise manufacturing a target substrate with components in recesses according to the methods described herein, wherein the components are light emitting devices forming pixels. If any broken pixels are found, these can be repaired as described by adding additional components. Alternatively, or in addition to using redundant recesses, broken components may also be removed from their respective recesses and replaced by the methods as described herein.

Figure 3A:
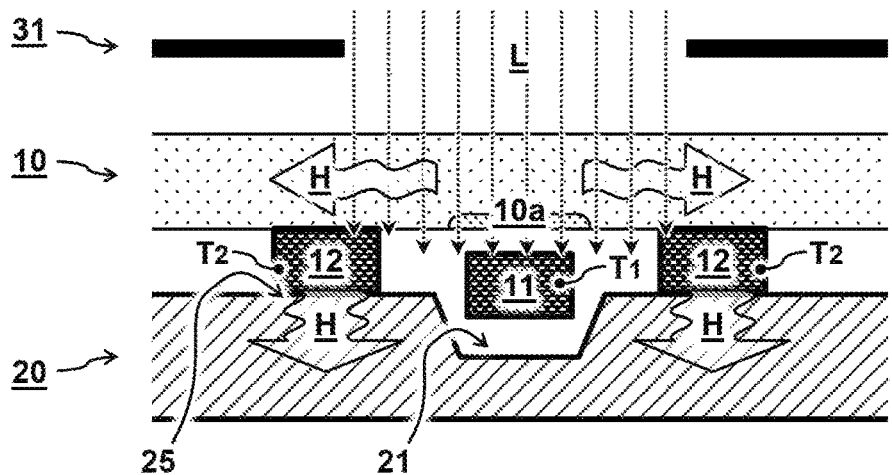
FIG. 3A schematically illustrates heat transfer through various components according to some embodiments.

FIG. 3A schematically illustrates principles of heat transfer H through various components as may occur in some embodiments. As previously mentioned, the contacting target substrate 20 can acts as a heat sink for the second subset of components 12. For example, a significant fraction of heat generated by the light, e.g. pulse, is dissipated through the contact with the target substrate 20, e.g. more than twenty percent, more fifty percent, or even more than eighty or ninety percent. This may be useful, in case at least some of the light "L" impinges at the second subset of components 12, e.g. directly heating the second subset of components 12. Alternatively, or in addition, it may be useful in case at least some of the light "L" impinges near the second subset of components 12, e.g. indirectly heating the second subset of components 12 via the donor substrate 10.

In the embodiment shown, the light "L" causes the first subset of components 11 to be heated to a first temperature T1 and the second subset of components 12 to a second temperature T2. By the measures described herein, it may occurs that the second temperature T2 is lower than the first temperature T1. Preferably, the first temperature T1 is above a threshold for releasing the first subset of components 11 from the donor substrate 10. In some embodiments, an area 10a of the donor substrate 10 holding the first subset of components 11 is disintegrated by the heating. In other or further embodiments, an adhesive between the donor substrate 10 and the first subset of components 11 is weakened to release the first subset of components 11. For example, an adhesive between the donor substrate 10 and the second subset of components 12 is not sufficiently weakened to release the second subset of components 12. Alternatively, or additionally, the adhesive may cool down after the light "L" is gone and its adhesive strength is restored while the second subset of components 12 still contact the donor substrate 10.

In some embodiments it is preferred that the target substrate 20 has a relatively high heat conduction coefficient at least at the contacting interface. For example, the heat conduction coefficient and/or heat capacity of the target substrate 20 is relatively high compared to the heat conduction coefficient and/or heat capacity of the donor substrate 10, e.g. ten percent higher or more, e.g. twice as much. Providing the donor substrate 10 with a relatively low heat conduction coefficient can also provide further benefits of lowering sideway conduction of heat H and/or facilitating heating of the components 11.

Figure 3B:
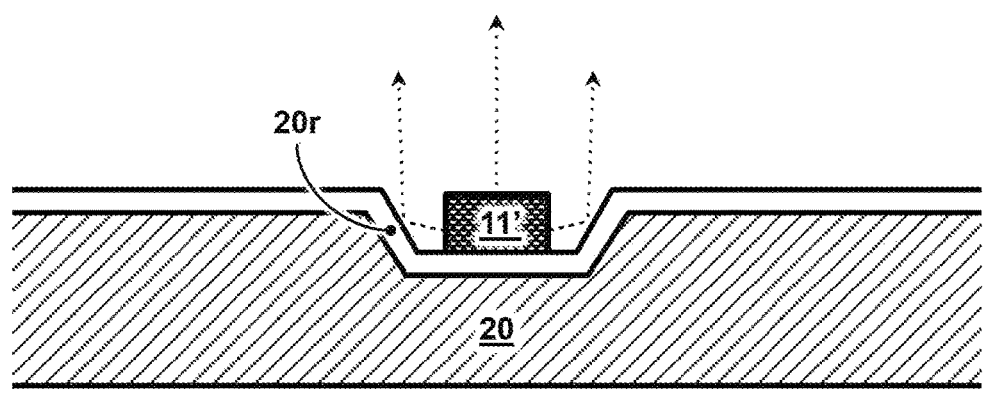
FIG. 3B schematically illustrates an embodiment wherein the target substrate has a reflective surface.

FIG. 3B schematically illustrates an embodiment wherein the target substrate 20 has a reflective surface 20r. Such feature may be combined with any embodiment described herein, and especially useful in case the deposited component 11' comprises a light emitting device, e.g. LED. As shown, the reflective surface 20r may improve perceived brightness of the LED by reflecting forward light that would otherwise be reflected sideways. In the embodiment shown, the recess comprises sloped edges which may further improve the reflection and can also provide synergetic advantage e.g. in deposition and alignment of the component. It will be further appreciated that the layer 20r may extend also over the rest of the surface in some embodiments. For example, the reflective layer may comprise a metal coating which can also act an improved heat sink for the components contacting the protrusions as describe herein.

Figure 3C:
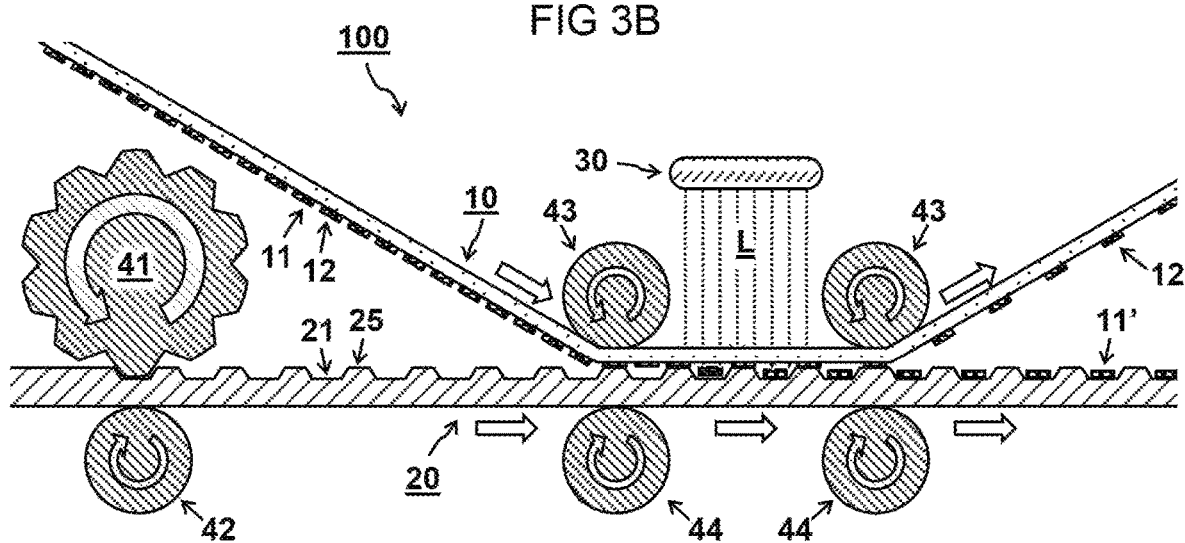
FIG. 3C schematically illustrates an embodiment of an apparatus for selective transfer of components.

FIG. 3C schematically illustrates an embodiment of an apparatus 100 for selective transfer of components.

In the embodiment shown, the apparatus 100 comprises or is configured to provide/manufacture a donor substrate 10 with a plurality of components 11,12 divided in different subsets as described earlier. The apparatus 100 also comprises or is configured to provide/manufacture a target substrate 20 with recesses 21 and protrusions 25 as described earlier. Preferably, the apparatus 100 comprises a substrate handler for aligning the donor and target substrates 10,20. For example, in the embodiment shown, the substrate handler comprises rollers 43,44 that bring the substrates together such that the first subset of components 11 is suspended over the corresponding recesses 21 without contacting the target substrate 20, and the second subset of components 12 is in contact with the corresponding protrusions 25 of the target substrate 20. While the substrates are aligned, a light source 30 projects light "L" onto one or more of the component layouts on the donor substrate 10. As shown this may cause transferring the first subset of components 11 across and into the corresponding recesses 21 while the second subset of components 12 remains attached to the donor substrate 10. While the embodiment illustrates a continuous, e.g. roll-to-roll<process, transfer can also be discrete, e.g. sheet-to-sheet, sheet-to-roll, or roll-to-sheet.

In some embodiments, a recess forming device is configured to form the recesses 21 in the target substrate 20. For example, an embossing tool 41,42 is shown here. Of course also other means can be envisaged for creating the recesses 21, e.g. a laser. Alternatively, or in addition to digging recesses 21 in the target substrate 20, it can be envisaged to e.g. deposit the protrusions 25 onto the target substrate 20 wherein recesses are formed at areas without the deposited protrusions. Also combinations can be envisaged. The substrate handler may also comprise other devices, e.g. for aligning and or synchronizing the transfer process. The alignment may also be intrinsic e.g. in the relative positioning of various apparatus components such as the recess forming device relative to a component forming device (not shown) forming the first subset of components 11,12 on the donor substrate 10.

Figure 4A:
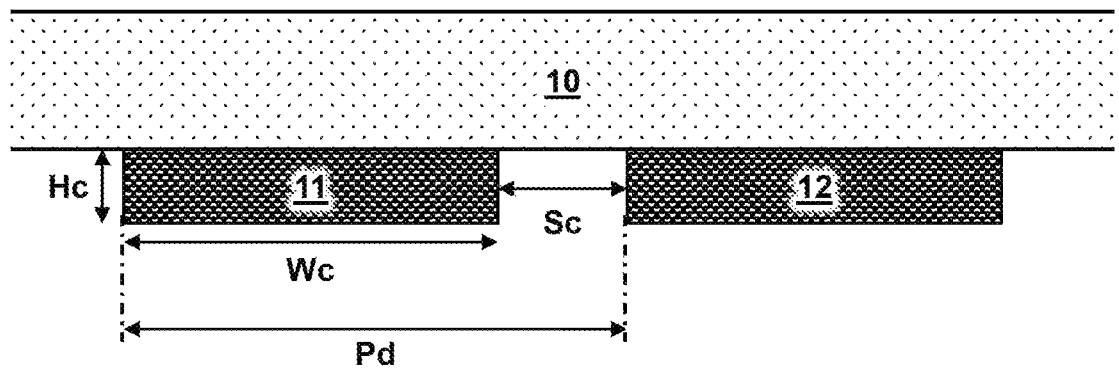
FIGS. 4A-4C schematically illustrate possible shapes, sizes, and distances according to some embodiments.

FIG. 4A schematically illustrates a donor substrate 10 with components 11,12 according to one embodiment.

In the embodiment shown, neighboring components 11,12 on the donor substrate 10 are spaced apart by an inter-component spacing Sc. For example, the inter-component spacing Sc is less than ten micrometer, preferably less than five micrometer, or less, e.g. between one and three micrometer. Advantageously, the smaller the inter-component spacing Sc between the components, the more effective the surface of the donor substrate 10 or precursor substrate, e.g. growth substrate, may be utilized.

In the embodiment shown, the components 11,12 have a component diameter Wc (along a surface of the donor substrate 10). For example, the component diameter Wc is less than hundred micrometer, preferably less than fifty micrometer, or even less than five micrometer, e.g. between 0.1-100 μm. Advantageously, the smaller the components, the more components fit the surface and hence, the more efficiently a surface can be used as a source for the component transfer.

In the embodiment shown, the components 11,12 have a component thickness Hc (transverse to the surface of the donor substrate 10). For example, the component thickness Hc is less than ten micrometer, preferably less than five micrometer, ore even less than three micrometer, e.g. between 0.1-10 μm. Advantageously, the thinner the components, the less material is needed for their manufacture, which may allow cheaper production.

In some embodiments, as shown, it may be preferably that the component diameter Wc is greater than the component thickness Hc, e.g. by a factor of at least two, three, five, or more. Advantageously, components with a diameter that is relatively large compared to their thickness may be more suitable for transfer as described herein, e.g. heat more quickly by the light and less prone to rotation while transferring mid air.

Figure 4B:
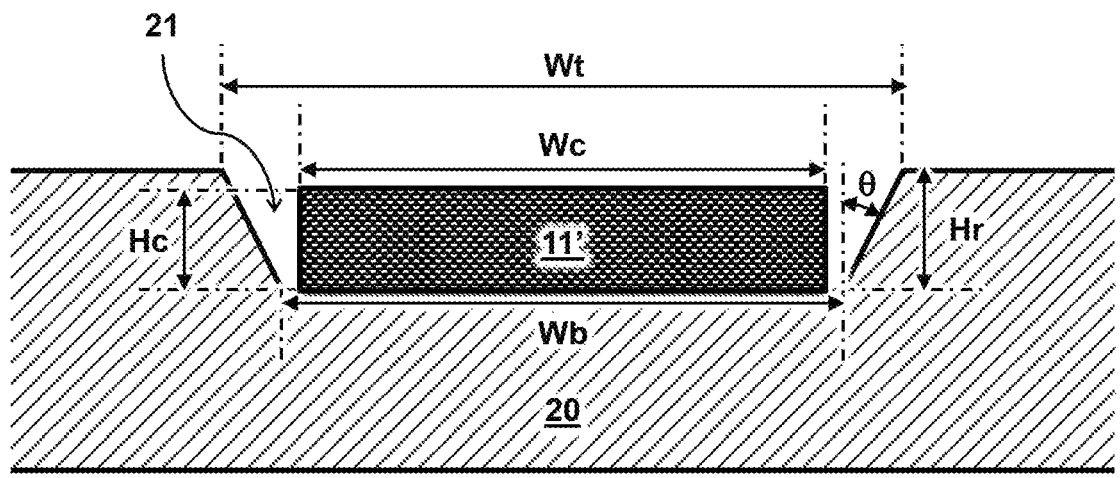

FIG. 4B schematically illustrates an embodiment of a target substrate 20 with a component 11 disposed in a recess 21.

In the embodiment shown, the bottom of the recess 21 has a bottom diameter Wb that is at least equal to the component diameter Wc. Otherwise it may be difficult to fit the component in the recess. Preferably, a bottom of the recesses 21 has a bottom diameter Wb that is less than 1.3 times the component diameter We, preferably less than 1.2, more preferably less than 1.1 times, e.g. between 1.00 and 1.05 times the component diameter Wc. Advantageously, the tighter the fit between the component diameter We and the bottom diameter Wb, the more accurate may the target position be defined.

In the embodiment shown, a top of the recess 21 has a top diameter Wt that is at least equal to the bottom diameter Wb, preferably larger by a factor or at least 1.1, more preferably at least 1.2, e.g. the top diameter Wt is between 1.2 to 1.5 times the bottom diameter Wb. Advantageously, by providing the recesses with a top diameter that is relatively wide compare to the bottom diameter, it may be easier to transfer the components into the recesses. In other or further embodiments, as shown, the outer edges of the recesses 21 are sloped at an angle θ with respect to a surface normal of the target substrate 20 and/or bottom. For example, the angle θ is more than ten degrees, preferably more than twenty degrees or more than thirty degrees, e.g. between forty and seventy degrees. Advantageously, sloped outer edges may held guide the components into the recesses, even if the component layout on the donor substrate is slightly misaligned with respect to the recesses. In some embodiments, the sloped edges may provided further functionality such as reflecting light emitted by a component in the recess.

Preferably, the recesses have a depth Hr that is at least equal half the component thickness Hc, preferably deeper. By providing sufficient recess depth, the target substrate may be sufficiently removed for effective component transfer. In some embodiments, as shown, the recesses have a depth Hr that is at least equal the component thickness Hc, preferably deeper e.g. by a factor of at least 1.01 or more, e.g. the recess depth Hr is between 1.1 and 1.5 times the component thickness. By providing recesses with depth greater than the component thickness, the components may be completely below the surface of the target substrate which can be of benefit for various reasons, e.g. in a subsequent transfer step or to connect electrodes to a top of the component flush with the top surface of the target substrate.

Figure 4C:
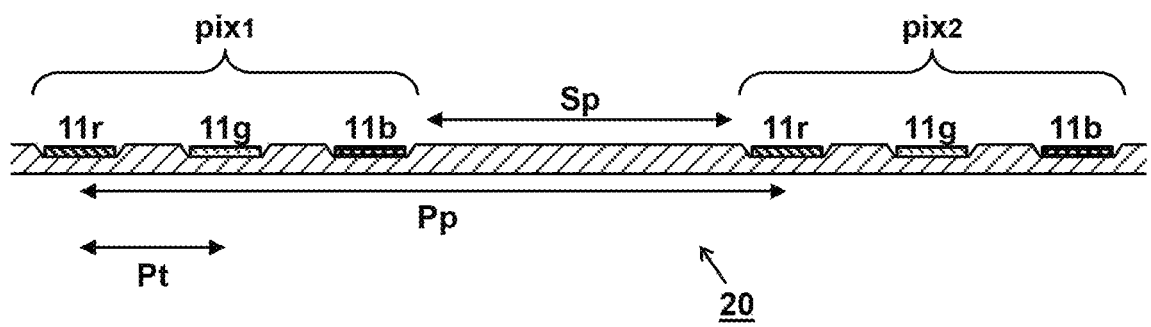

FIG. 4C schematically illustrates an embodiment of a target substrate 20 with a different components 11r,11g,11b, e.g. manufactured as described with reference to FIGS. 2A-2C.

In some embodiments, e.g. as shown, a periodic distance or pitch Pt of components on the target substrate 20 is greater than a periodic distance or pitch Pd of components on the donor substrate 10, e.g. by a factor of at least two, three, five, or more. For example, the pitch Pd of components on the donor substrate 10 is ten micrometer while the pitch Pt of components on the target substrate 20 is more than twenty micrometer, e.g. up to hundred micrometer, or more.

In some embodiments, the components 11 comprise light emitting devices, e.g. μLEDSs. In other or further embodiments, the components are grouped. For example, each group comprises light emitting devices configured to emit different colors, e.g. red, green and blue. In the embodiment shown, the groups of components 11r,11g,11b form pixels indicated as pix1 and pix2 here. For example, the target substrate 20 is part of a display screen, e.g. a monochrome or color display. In the embodiment shown, the groups of components, e.g. pixels, are spaced apart with an inter-pixel spacing Sp that is greater than the inter-component spacing Sc, though this is not necessary. Typically the pixels have a pitch Pp between forty and four hundred micrometer, or more. For example, a resolution of 70 pixels per inch PPI may correspond to a pitch of 25400/70=363 μm. For example, a resolution of 600 PPI may correspond to a pitch of 42 μm. So for a resolution of 600 PPI, the pitch Pt of grouped components may be even smaller, e.g. 42 μm/3 components=14 μm micrometer per component or smaller. Of course also other resolutions are possible.

For the purpose of clarity and a concise description, features are described herein as part of the same or separate embodiments, however, it will be appreciated that the scope of the invention may include embodiments having combinations of all or some of the features described. For example, while embodiments were shown in cross-section view with a rows of components, of course the substrates and layouts can be two dimensional, e.g. comprising additional rows of component in various layouts. Also alternative ways may be envisaged by those skilled in the art having the benefit of the present disclosure for achieving a similar function and result. E.g. features of different layouts may be combined or split up into one or more alternative embodiments.

Hybrid contact/non-contact approaches as described herein may have advantages for targeted component, e.g. with the design of the cavity adapted to the component dimensions, a mechanical self-alignment is provided ensuring a high placement accuracy. This can be optionally further enhanced through reflow self-alignment in the cavity. For non-targeted components: during the transfer process, non-targeted components remain in contact with the receiving substrate, providing, on the one hand, a mechanical stop against undesired/accidental transfer. On the other hand, the physical contact of components with the receiving substrate enables an additional approach for selective transfer. While some transfer methods may use a patterned light-source directing the light only to the targeted components, the physical contact of the components can provide a heat-sink at the non-targeted locations, enabling selective component transfer also with a non-patterned light-source. Also, the non-targeted components in contact with the substrate may ensuring a well-defined stand-off height for the targeted components.

The various elements of the embodiments as discussed and shown thus offer various advantages, including an advantage that parts where the target substrate contacts the non-transferred components may prevent their transfer by physical blocking and heat-sinking, the advantage that in a second iteration (e.g. with different LEDS), the previously placed components do not obstruct the new components; an advantage that the recesses can provide alignment and constriction of placed components; and advantage that sloped edges of the recesses could further help with placement and may also provide a reflection surface e.g. for the LEDS. Of course, it is to be appreciated that any one of the above embodiments or processes may be combined with one or more other embodiments or processes to provide even further improvements in finding and matching designs and advantages. It is appreciated that this disclosure offers particular advantages to manufacture and repair of display, particularly using microscopic sized LEDs, and in general can be applied for any application wherein components are selectively transferred by light.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method for light induced selective transfer of components, the method comprising:
   providing a donor substrate with a plurality of components divided in different subsets including at least:
      a first subset of components selected for transfer during a first transfer step and arranged according to a first component layout; and
      a second subset of components selected to remain on the donor substrate during the first transfer step and arranged according to a second component layout;
   providing a target substrate comprising:
      recesses disposed at least at relative positions corresponding to the first component layout, and
      protrusions formed by non-recessed areas of the target substrate disposed at least at relative positions corresponding to the second component layout;
   aligning the donor and target substrates wherein, during the aligning:
      the first subset of components is suspended over the corresponding recesses without contacting the target substrate, and
      the second subset of components is in contact with the corresponding protrusions of the target substrate; and projecting, in the first transfer step, light onto at least the first component layout on the donor substrate to transfer the first subset of components, suspended over the corresponding recesses in accordance with the aligning, across and into the corresponding recesses while the second subset of components, in contact with the corresponding protrusions in accordance with the aligning, remains attached to the donor substrate.

2. The method according to claim 1, wherein the second subset of components is selected for transfer during a second transfer step,
   wherein the second transfer step is separate from the first transfer step,
   wherein the second transfer step comprises aligning the donor substrate with the remaining second subset of components over the same or another target substrate comprising corresponding recesses disposed at least at relative positions corresponding to the second component layout,
   wherein, in the second transfer step, light is projected onto at least the second component layout on the donor substrate to transfer the second subset of components, aligned with the corresponding recesses, across and into the corresponding recesses.

3. The method according to claim 2, wherein each one of the first transfer step and the second transfer step is effected by a separate pulse of light.

4. The method according to claim 1, wherein components of first subset of components are interspersed with components of the second subset of components on the donor substrate, wherein the second subset of components have the same relative positions as the first subset of components.

5. The method according to claim 1, wherein components of the second subset of components are neighboring components of the first subset of components on the donor substrate.

6. The method according to claim 1, wherein the contacting target substrate acts as a heat sink for the second subset of components during the first transfer step,
   wherein a fraction of more than twenty percent of heat generated by the light is dissipated through contact of the second subset of components with the target substrate.

7. The method according to claim 1, wherein the light causes the first subset of components to be heated to a first temperature and the second subset of components to a second temperature,
   wherein the second temperature is lower than the first temperature,
   wherein the first temperature is above a threshold for releasing the first subset of components from the donor substrate, and
   wherein the second temperature is below said threshold.

8. The method according to claim 1, wherein outer edges of the recesses are sloped at an angle with respect to a surface normal of the target substrate and/or bottom, wherein the angle is between ten and eighty degrees.

9. The method according to claim 1, wherein the first subset of components comprise light emitting devices and the recesses comprise a reflective surface.

10. The method according to claim 1, wherein components of the first subset of components and the second subset of components have a component diameter along a surface of the donor substrate of less than hundred micrometer, and
    wherein the component diameter is greater than the component thickness by a factor of at least two.

11. The method according to claim 1, wherein a pitch of components on the target substrate is greater than a pitch of components on the donor substrate, by a factor of at least two.

12. The method according to claim 1, wherein during the first transfer step, a first component of the first subset of components is transferred from a first donor substrate in a first recess on the target substrate,
- wherein, during a second transfer step, a second component of the first subset of components is transferred from a second donor substrate into a second recess,
- wherein, during the second transfer step, another component on the second donor substrate is suspended over the first component previously deposited in the first recess, and
- wherein the first recess is at least as deep as a thickness of the previously deposited first component.

13. The method according to claim 1, wherein a previously manufactured target substrate with previously deposited components in recesses is repaired,
- wherein the target substrate comprises redundant empty recesses adjacent the recesses with the previously deposited components, and
- wherein the method comprises:
  - locating a broken component among the previously deposited components, and
  - adding another component in a redundant recess adjacent the broken component by repeating the method.

14. The method according to claim 13, wherein the components are light emitting devices, and
- wherein the method further comprises:
  - testing the presence of broken components on the target substrate; and
  - iterating the method for any broken components to repair the target substrate and manufacture a display screen.

15. An apparatus for light induced selective transfer of components, the apparatus comprising:
- a donor substrate with a plurality of components divided in different subsets including at least:
  - a first subset of components selected for transfer during a first transfer step and arranged according to a first component layout; and
  - a second subset of components selected to remain on the donor substrate during the first transfer step and arranged according to a second component layout;
- a target substrate comprising:
  - recesses disposed at least at relative positions corresponding to the first component layout, and
  - protrusions formed by non-recessed areas of the target substrate disposed at least at relative positions corresponding to the second component layout;
- a substrate handler for aligning the donor and target substrates such that:
  - the first subset of components is suspended over corresponding ones of the recesses without contacting the target substrate, and
  - the second subset of components is in contact with the corresponding protrusions of the target substrate; and
- a light source configured for, in the first transfer step, projecting light onto at least the first component layout on the donor substrate to transfer the first subset of components, suspended over the corresponding recesses in accordance with the aligning, across and into the corresponding recesses while the second subset of components, in contact with the corresponding protrusions in accordance with the aligning, remains attached to the donor substrate.

16. The apparatus according to claim 15, wherein the second subset of components is selected for transfer during a second transfer step,
- wherein the second transfer step is separate from the first transfer step,
- wherein the second transfer step comprises aligning the donor substrate with the remaining second subset of components over the same or another target substrate comprising corresponding recesses disposed at least at relative positions corresponding to the second component layout,
- wherein, in the second transfer step, light is projected onto at least the second component layout on the donor substrate to transfer the second subset of components, aligned with the corresponding recesses, across and into the corresponding recesses.

17. The apparatus according to claim 16, wherein each one of the first transfer step and the second transfer step is effected by a separate pulse of light.

18. The apparatus according to claim 15, wherein components of first subset of components are interspersed with components of the second subset of components on the donor substrate, wherein the second subset of components have the same relative positions as the first subset of components.

19. The apparatus according to claim 15, wherein components of the second subset of components are neighboring components of the first subset of components on the donor substrate.

20. The apparatus according to claim 15, wherein the contacting target substrate acts as a heat sink for the second subset of components during the first transfer step,
- wherein a fraction of more than twenty percent of heat generated by the light is dissipated through contact of the second subset of components with the target substrate.

* * * * *